(12) United States Patent
Weidinger et al.

(10) Patent No.: US 12,185,478 B2
(45) Date of Patent: Dec. 31, 2024

(54) PRINTED CIRCUIT BOARD HAVING EMBEDDED COMPONENT

(71) Applicant: AT&S Austria Technologie & Systemtechnik Aktiengesellschaft, Leoben (AT)

(72) Inventors: Gerald Weidinger, Leoben (AT); Andreas Zluc, Leoben (AT); Johannes Stahr, St. Lorenzen (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 58 days.

(21) Appl. No.: 18/055,759

(22) Filed: Nov. 15, 2022

(65) Prior Publication Data

US 2023/0189448 A1 Jun. 15, 2023

Related U.S. Application Data

(63) Continuation of application No. 16/184,470, filed on Nov. 8, 2018, now Pat. No. 11,523,520, which is a
(Continued)

(30) Foreign Application Priority Data

Feb. 27, 2014 (AT) .............................. A 50152/2014

(51) Int. Cl.
*H05K 3/46* (2006.01)
*H05K 1/11* (2006.01)
(Continued)

(52) U.S. Cl.
CPC ............. *H05K 3/4644* (2013.01); *H05K 1/11* (2013.01); *H05K 1/186* (2013.01); *H05K 1/188* (2013.01);
(Continued)

(58) Field of Classification Search
CPC .......... H05K 1/11; H05K 1/186; H05K 1/188; H05K 2201/0154; H05K 2201/09036; H05K 3/0082; H05K 3/06
See application file for complete search history.

(56) References Cited

U.S. PATENT DOCUMENTS

| 4,931,134 A | 6/1990 | Hatkevitz et al. |
| 5,206,188 A | 4/1993 | Hiroi et al. |
| (Continued) | | |

FOREIGN PATENT DOCUMENTS

| AT | 13434 U1 | 12/2013 |
| CN | 100525591 C | 8/2009 |
| (Continued) | | |

OTHER PUBLICATIONS

Austrian Search Report for Application No. A 740/2012, Filing Date Jul. 7, 2012, Search Completed May 3, 2013, 2 pgs.
(Continued)

*Primary Examiner* — Minh N Trinh
(74) *Attorney, Agent, or Firm* — KPPB LLP (57) ABSTRACT

The disclosure pertains to a method for the bonding of a component embedded into a printed circuit board. The methods include provisions of a core exhibiting at least one insulating layer and at least one conductor layer applied to the insulating layer. Methods may also include embedding at least one component into a recess of the insulating layer, wherein the contacts of the component are essentially situated in the plane of an outer surface of the core exhibiting the at least one conductor layer. Methods may also include application of a photoimageable resist onto the one outer surface of the core on which the component is arranged, while filling the spaces between the contacts of the component. Methods may also include clearing of end faces of the contacts and of the areas of the conductor layer covered by
(Continued)

the photoimageable resist by exposing and developing the photoimageable resist.

19 Claims, 1 Drawing Sheet

Related U.S. Application Data continuation-in-part of application No. 15/122,114, filed as application No. PCT/AT2015/050052 on Feb. 26, 2015, now Pat. No. 10,187,997.

(51) Int. Cl.
*H05K 1/18* (2006.01)
*H05K 3/00* (2006.01)
*H05K 3/06* (2006.01)
*H05K 3/26* (2006.01)
*H05K 3/32* (2006.01)
*H05K 3/10* (2006.01)

(52) U.S. Cl.
CPC .............. *H05K 3/0082* (2013.01); *H05K 3/06* (2013.01); *H05K 3/26* (2013.01); *H05K 3/32* (2013.01); *H05K 3/064* (2013.01); *H05K 3/108* (2013.01); *H05K 2201/0154* (2013.01); *H05K 2201/09036* (2013.01)

(56) References Cited

U.S. PATENT DOCUMENTS

| | | |
|---|---|---|
| 5,241,456 A | 8/1993 | Marcinkiewicz et al. |
| 5,561,085 A | 10/1996 | Gorowitz et al. |
| 5,645,673 A | 7/1997 | Fasano et al. |
| 5,730,635 A | 3/1998 | De Haas et al. |
| 6,005,289 A | 12/1999 | Watanabe |
| 6,120,693 A | 9/2000 | Petti et al. |
| 6,163,049 A | 12/2000 | Bui |
| 6,309,912 B1 | 10/2001 | Chiou et al. |
| 6,324,067 B1 | 11/2001 | Nishiyama |
| 6,442,033 B1 | 8/2002 | Lu et al. |
| 6,492,726 B1 | 12/2002 | Ang |
| 6,506,632 B1 | 1/2003 | Cheng et al. |
| 6,674,159 B1 | 1/2004 | Peterson |
| 6,687,985 B2 | 2/2004 | Nishiyama |
| 6,732,428 B1 | 5/2004 | Kwong |
| 6,815,046 B2 | 11/2004 | Kumano |
| 6,903,458 B1 | 6/2005 | Nathan |
| 6,919,508 B2 | 7/2005 | Forcier |
| 7,087,991 B2 | 8/2006 | Chen et al. |
| 7,154,760 B2 | 12/2006 | Tsuchiya |
| 7,282,394 B2 | 10/2007 | Cho et al. |
| 7,629,204 B2 | 12/2009 | Hsu |
| 7,705,446 B2 | 4/2010 | Chia et al. |
| 7,719,104 B2 | 5/2010 | Hsu et al. |
| 7,863,735 B1 | 1/2011 | Cho et al. |
| 7,894,203 B2 | 2/2011 | Tsuda |
| 7,947,906 B2 | 5/2011 | Lee et al. |
| 7,977,579 B2 | 7/2011 | Bathan |
| 8,049,114 B2 | 11/2011 | Chen et al. |
| 8,101,868 B2 | 1/2012 | Ito et al. |
| 8,130,507 B2 | 3/2012 | Origuchi et al. |
| 8,186,045 B2 | 5/2012 | Sakamoto et al. |
| 8,217,509 B2 | 7/2012 | Horiuchi et al. |
| 8,320,135 B2 | 11/2012 | Ito et al. |
| 8,354,743 B2 | 1/2013 | Jensen |
| 8,381,394 B2 | 2/2013 | Shizuno |
| 8,400,776 B2 | 3/2013 | Sahara et al. |
| 8,547,701 B2 | 10/2013 | Tuominen et al. |
| 8,563,358 B2 | 10/2013 | Landesberger et al. |
| 8,642,465 B2 | 2/2014 | Schimetta et al. |
| 8,736,065 B2 | 5/2014 | Gonzalez et al. |
| 8,785,788 B2 | 7/2014 | Shimizu et al. |
| 8,789,271 B2 | 7/2014 | Zluc et al. |
| 8,829,357 B2 | 9/2014 | Mikado et al. |
| 8,914,974 B2 | 12/2014 | Lenhardt et al. |
| 9,159,693 B2 | 10/2015 | Choi |
| 9,179,553 B2 | 11/2015 | Suzuki |
| 9,418,930 B2 | 8/2016 | Stahr et al. |
| 9,560,769 B2 | 1/2017 | Shimabe et al. |
| 9,648,758 B2 | 5/2017 | Gotzinger et al. |
| 9,713,248 B2 | 7/2017 | Langer et al. |
| 9,763,337 B2 | 9/2017 | Jager et al. |
| 9,781,845 B2 | 10/2017 | Stahr et al. |
| 9,820,381 B2 | 11/2017 | Wang et al. |
| 10,187,997 B2 | 1/2019 | Weidinger et al. |
| 10,219,384 B2 | 2/2019 | Stahr et al. |
| 10,779,413 B2 | 9/2020 | Schwarz et al. |
| 11,172,576 B2 | 11/2021 | Stahr et al. |
| 11,523,520 B2 | 12/2022 | Weidinger et al. |
| 2002/0036100 A1 | 3/2002 | Slemmons et al. |
| 2003/0015342 A1 | 1/2003 | Sakamoto et al. |
| 2003/0090883 A1 | 5/2003 | Asahi et al. |
| 2003/0146012 A1 | 8/2003 | Song et al. |
| 2004/0014317 A1 | 1/2004 | Sakamoto et al. |
| 2004/0114652 A1 | 6/2004 | Yoshikawa |
| 2004/0168825 A1 | 9/2004 | Sakamoto et al. |
| 2004/0170766 A1 | 9/2004 | Inoue et al. |
| 2004/0233650 A1 | 11/2004 | Miyashita et al. |
| 2005/0017347 A1 | 1/2005 | Morimoto et al. |
| 2005/0048759 A1 | 3/2005 | Hsu |
| 2005/0103522 A1 | 5/2005 | Grundy et al. |
| 2005/0189640 A1 | 9/2005 | Grundy et al. |
| 2005/0190537 A1 | 9/2005 | Rossi et al. |
| 2005/0233122 A1 | 10/2005 | Nishimura et al. |
| 2006/0008970 A1 | 1/2006 | Oggioni et al. |
| 2006/0049530 A1 | 3/2006 | Hsu et al. |
| 2006/0101638 A1 | 5/2006 | Germann et al. |
| 2006/0120056 A1 | 6/2006 | Sasaki |
| 2006/0193108 A1 | 8/2006 | Usui et al. |
| 2006/0198570 A1 | 9/2006 | Ogawa et al. |
| 2006/0222285 A1 | 10/2006 | Minamio et al. |
| 2006/0231950 A1 | 10/2006 | Yoon |
| 2006/0278967 A1 | 12/2006 | Tuominen et al. |
| 2007/0069352 A1 | 3/2007 | Ho et al. |
| 2007/0131349 A1 | 6/2007 | Tuominen et al. |
| 2007/0166886 A1 | 7/2007 | Iihola et al. |
| 2007/0209831 A1 | 9/2007 | Sakamoto et al. |
| 2008/0067666 A1 | 3/2008 | Hsu |
| 2008/0192443 A1 | 8/2008 | Hatanaka et al. |
| 2008/0192450 A1 | 8/2008 | Tuominen et al. |
| 2008/0196931 A1 | 8/2008 | Lee et al. |
| 2008/0202801 A1 | 8/2008 | Tuominen et al. |
| 2008/0264687 A1 | 10/2008 | Park et al. |
| 2008/0283491 A1 | 11/2008 | Arai et al. |
| 2008/0296056 A1 | 12/2008 | Kinoshita et al. |
| 2009/0001609 A1 | 1/2009 | Lim |
| 2009/0014749 A1 | 1/2009 | Matsuda et al. |
| 2009/0026168 A1 | 1/2009 | Tsai et al. |
| 2009/0194318 A1 | 8/2009 | Yeon et al. |
| 2009/0205859 A1 | 8/2009 | Tanaka et al. |
| 2009/0241333 A1 | 10/2009 | He et al. |
| 2009/0242251 A1 | 10/2009 | Park et al. |
| 2009/0277673 A1 | 11/2009 | Sohn et al. |
| 2009/0293271 A1 | 12/2009 | Tanaka |
| 2009/0310323 A1 | 12/2009 | Baek et al. |
| 2010/0018761 A1 | 1/2010 | Wang et al. |
| 2010/0019368 A1 | 1/2010 | Shin |
| 2010/0084175 A1 | 4/2010 | Suzuki et al. |
| 2010/0170703 A1 | 7/2010 | Iihola et al. |
| 2010/0252303 A1 | 10/2010 | Chang et al. |
| 2010/0282498 A1 | 11/2010 | Tezak et al. |
| 2011/0089531 A1 | 4/2011 | Hillman et al. |
| 2011/0127076 A1 | 6/2011 | Jeong et al. |
| 2011/0127675 A1 | 6/2011 | Ewe et al. |
| 2011/0183093 A1 | 7/2011 | Wada |
| 2011/0198018 A1 | 8/2011 | Schrittwieser et al. |
| 2011/0203836 A1 | 8/2011 | Yokota et al. |
| 2011/0212274 A1 | 9/2011 | Selsley et al. |
| 2011/0215464 A1 | 9/2011 | Guzek et al. |
| 2011/0259630 A1 | 10/2011 | Park |
| 2011/0272177 A1 | 11/2011 | Weichsiberger et al. |
| 2011/0284267 A1 | 11/2011 | Chang |

(56) References Cited

U.S. PATENT DOCUMENTS

| | | |
|---|---|---|
| 2011/0290408 A1 | 12/2011 | Samejima et al. |
| 2011/0290546 A1 | 12/2011 | Lee et al. |
| 2011/0304998 A1 | 12/2011 | Lin |
| 2011/0317381 A1 | 12/2011 | Kim et al. |
| 2012/0024583 A1 | 2/2012 | Lee et al. |
| 2012/0048605 A1 | 3/2012 | Chung |
| 2012/0091594 A1 | 4/2012 | Landesberger et al. |
| 2012/0153493 A1 | 6/2012 | Lee et al. |
| 2012/0181074 A1 | 7/2012 | Ishihara et al. |
| 2012/0247819 A1 | 10/2012 | Tsuyutani et al. |
| 2013/0146991 A1 | 6/2013 | Otremba et al. |
| 2013/0153269 A1 | 6/2013 | Takahashi et al. |
| 2013/0256884 A1 | 10/2013 | Meyer |
| 2014/0000941 A1 | 1/2014 | Weidinger et al. |
| 2014/0120291 A1 | 5/2014 | Kim et al. |
| 2014/0227834 A1 | 8/2014 | Karpman |
| 2014/0254119 A1 | 9/2014 | Im |
| 2015/0007934 A1 | 1/2015 | Götzinger et al. |
| 2015/0157862 A1 | 6/2015 | Greenberg et al. |
| 2015/0189763 A1 | 7/2015 | Schrittwieser |
| 2015/0334833 A1 | 11/2015 | Wang et al. |
| 2015/0334841 A1 | 11/2015 | Schmid et al. |
| 2015/0334844 A1 | 11/2015 | Shimabe et al. |
| 2015/0342062 A1 | 11/2015 | Jäger et al. |
| 2016/0021763 A1 | 1/2016 | Stahr et al. |
| 2016/0133558 A1 | 5/2016 | Stahr et al. |
| 2016/0324004 A1 | 11/2016 | Schwarz et al. |
| 2016/0353566 A1 | 12/2016 | Ianger et al. |
| 2017/0034923 A1 | 2/2017 | Lin et al. |
| 2017/0048984 A1 | 2/2017 | Weidinger et al. |
| 2017/0164481 A1 | 6/2017 | Stahr et al. |
| 2019/0082543 A1 | 3/2019 | Weidinger et al. |
| 2019/0150288 A1 | 5/2019 | Stahr et al. |
| 2020/0323081 A1 | 10/2020 | Schwarz et al. |
| 2023/0189448 A1* | 6/2023 | Weidinger ........... H05K 3/4644 216/13 |

FOREIGN PATENT DOCUMENTS

| | | |
|---|---|---|
| CN | 102293070 A | 12/2011 |
| CN | 103199069 A | 7/2013 |
| CN | 203072246 U | 7/2013 |
| DE | 19642488 A1 | 4/1998 |
| DE | 20021698 U1 | 4/2001 |
| DE | 20221189 U1 | 6/2005 |
| DE | 102006009723 A1 | 9/2007 |
| DE | 102008025223 A1 | 12/2008 |
| DE | 102008040906 A1 | 2/2010 |
| DE | 102010042567 B3 | 3/2012 |
| EP | 195935 A2 | 10/1986 |
| EP | 275433 A1 | 7/1988 |
| EP | 1225629 A2 | 7/2002 |
| EP | 1304742 A2 | 4/2003 |
| EP | 1424731 A2 | 6/2004 |
| EP | 2119327 B1 | 10/2011 |
| FR | 2822338 A1 | 9/2002 |
| GB | 2485087 A | 5/2012 |
| JP | 11150368 A | 6/1999 |
| JP | 2003031914 A | 1/2003 |
| JP | 2003198133 A | 7/2003 |
| JP | 2004031682 A | 1/2004 |
| JP | 2005333109 A | 12/2005 |
| JP | 2007189006 A | 7/2007 |
| JP | 2007318090 A | 12/2007 |
| JP | 2010206124 A | 9/2010 |
| JP | 2011138873 A | 7/2011 |
| JP | 2012044102 A | 3/2012 |
| JP | 2012151359 A | 8/2012 |
| KR | 101253514 B1 | 4/2013 |
| WO | 1998020530 A1 | 5/1998 |
| WO | 2003092344 A1 | 11/2003 |
| WO | 2005020651 A1 | 3/2005 |
| WO | 2005104636 A1 | 11/2005 |
| WO | 2006013230 A2 | 2/2006 |
| WO | 2006134217 A1 | 12/2006 |
| WO | 2007087660 A1 | 8/2007 |
| WO | 2008098271 A1 | 8/2008 |
| WO | 2008104324 A1 | 9/2008 |
| WO | 2009143550 A1 | 12/2009 |
| WO | 2010048654 A1 | 5/2010 |
| WO | 2010085830 A1 | 8/2010 |
| WO | 2011088489 A1 | 7/2011 |
| WO | 2011099820 A2 | 8/2011 |
| WO | 2012016258 A2 | 2/2012 |
| WO | 2012065202 A1 | 5/2012 |
| WO | 2012100274 A1 | 8/2012 |
| WO | 2013029073 A1 | 3/2013 |
| WO | 2013029074 A1 | 3/2013 |
| WO | 2014131071 A2 | 9/2014 |
| WO | 2014197917 A1 | 12/2014 |
| WO | 2015077808 A1 | 6/2015 |
| WO | 2015085342 A1 | 6/2015 |
| WO | 2015113088 | 8/2015 |
| WO | 2015127489 | 9/2015 |

OTHER PUBLICATIONS

International Preliminary Report on Patentability for International Application No. PCT/AT2013/000029, Report issued Aug. 26, 2014, Mailed Sep. 4, 2014, 13 Pgs.

International Preliminary Report on Patentability for International Application No. PCT/AT2013/050128, Report completed Sep. 16, 2014, 11 Pgs.

International Preliminary Report on Patentability for International Application No. PCT/AT2013/050249, Report issued Jun. 30, 2015, Mailed Jul. 9, 2015, 6 Pgs.

International Preliminary Report on Patentability for International Application No. PCT/AT2013/050260, Report issued Mar. 27, 2015, Mailed Mar. 27, 2015, 8 Pgs.

International Preliminary Report on Patentability for International Application No. PCT/AT2013/050262, Report issued Mar. 11, 2015, Mailed Mar. 11, 2015, 14 Pgs.

International Preliminary Report on Patentability for International Application No. PCT/AT2014/050239, Report issued Mar. 1, 2016, Mailed Jun. 1, 2016, 9 Pgs.

International Preliminary Report on Patentability for International Application PCT/AT2014/050044, Report Completed Jun. 23, 2015, Mailed Jun. 23, 2015, 18 Pgs.

International Preliminary Report on Patentability for International Application PCT/AT2014/050113, Report issued Aug. 28, 2015, Mailed Aug. 28, 2015, 8 Pgs.

International Preliminary Report on Patentability for International Application PCT/AT2014/050300, Report issued Oct. 10, 2015, Mailed Mar. 23, 2016, 9 Pgs.

International Preliminary Report on Patentability for International Application PCT/AT2015/050019, Report issued Aug. 2, 2016, Mailed Aug. 11, 2016, 8 Pgs.

International Preliminary Report on Patentability for International Application PCT/AT2015/050052, Report issued Jun. 6, 2016, Mailed Dec. 23, 2015, 16 Pgs.

International Search Report for International Application No. PCT/AT2014/050300, Search completed Mar. 13, 2015, Mailed Mar. 23, 2015, 3 Pgs.

International Search Report and Written Opinion for International Application No. PCT/AT2013/050262, Search completed Mar. 18, 2014, Mailed Mar. 27, 2014, 9 Pgs.

International Search Report and Written Opinion for International Application No. PCT/AT2014/050044, Search completed May 9, 2014, Mailed May 20, 2014, 9 Pgs.

International Search Report and Written Opinion for International Application No. PCT/AT2014/050239, Search completed Feb. 2, 2015, Mailed Feb. 9, 2015, 8 Pgs.

International Search Report and Written Opinion for International Application No. PCT/AT2015/050019, Search completed Apr. 23, 2015, Mailed May 27, 2015, 9 Pgs.

International Search Report and Written Opinion for International Application No. PCT/AT2015/050052, Search completed May 26, 2015, Mailed Jun. 2, 2015, 10 Pgs.

(56) References Cited

OTHER PUBLICATIONS

International Search Report for International Application No. PCT/AT2013/050128, International Filing Date Jun. 25, 2013, Search Completed Oct. 23, 2013, Mailed Nov. 26, 2013, 6 pgs.
International Search Report for International Application No. PCT/AT2013/050249, Search completed Apr. 1, 2014, Mailed Sep. 4, 2014, 4 Pgs.
International Search Report for International Application No. PCT/AT2013/050260, Search completed Apr. 29, 2014, Mailed May 13, 2014, 4 Pgs.
International Search Report for International Application PCT/AT2013/000029. completed May 31, 2013, mailed Jun. 7, 2013, 6 pgs.
International Search Report for International Application PCT/AT2014/050113, Report completed Aug. 22, 2014, Mailed Aug. 28, 2014, 3 Pgs.
Written Opinion for International Application No. PCT/AT2013/050128, Search Completed Oct. 23, 2013, Mailed Nov. 26, 2013, 5 pgs.
Written Opinion for International Application No. PCT/AT2013/050249, Search completed Apr. 1, 2014, Mailed Sep. 4, 2014, 5 Pgs.
Written Opinion for International Application No. PCT/AT2013/050260, Search completed Apr. 29, 2014, Mailed May 13, 2014, 4 Pgs.
Written Opinion for International Application No. PCT/AT2014/050300, Search completed Mar. 13, 2015, Mailed Mar. 23, 2015, 7 Pgs.
Written Opinion for International Application PCT/AT2013/000029, completed May 31, 2013, mailed Jun. 7, 2013, 5 pgs.
Written Opinion for International Application PCT/AT2014/050113, Report completed Aug. 22, 2014, Mailed Aug. 28, 2014, 6 Pgs.
Charboneau, B C et al., "Double-Sided Liquid Cooling for Power Semiconductor Devices Using Embedded Power Packaging", IEEE Transactions on Industry Applications, IEEE Service Center, vol. 44, No. 5, Sep. 1, 2008, pp. 1645-1655, XP011446042, ISSN: 0093-994, DOI: 10.1109/TIA.2008.2002270.
Jian, Yin, "High Temperature SiC Embedded Chip Module (ECM) with Double-sided Metallization Structure", Jan. 3, 2006, XP055135318, Gefunden im Internet: URL:http://hdl.handle.net/ 10919/30076.
Mital et al., , "Thermal Design Methodology for an Embedded Power Electronic Module Using Double-Sided Microchannel Cooling", Journal of Electric Packaging, ASME International, US, vol. 130, No. 3, Sep. 1, 2008, XP008171354, DOI: 10.1115/1.2957320, Retrieved on Jul. 29, 2008.
Pang, Y et al., "Assessment of Some Integrated Cooling Mechanisms for an Active Integrated Power Electronics Module", Journal of Electronic Packaging, ASME International, US, vol. 129, No. 1, Mar. 1, 2007, pp. 1-8, XP008171355, ISSN: 1 043-7398, DOI: 1 0.1115/1.2429703.

* cited by examiner

PRINTED CIRCUIT BOARD HAVING EMBEDDED COMPONENT

CROSS REFERENCE TO RELATED APPLICATIONS

This application is a continuation of U.S. patent application Ser. No. 16/184,470, filed Nov. 8, 2018, now U.S. Pat. No. 11,523,520, issued on Dec. 6, 2022, which is a continuation in part of U.S. patent application Ser. No. 15/122,114, filed Aug. 26, 2016, now U.S. Pat. No. 10,187,997, issued on Jan. 22, 2019, which is a U.S. national stage of PCT Application No. PCT/AT2015/050052, filed Feb. 2, 2015, which claims priority to Austrian Application No. A50152/2014, filed Feb. 27, 2014, the disclosures of which are incorporated by reference herein in their entirety.

BACKGROUND OF THE INVENTION

Field of Invention

The invention pertains to a method for the bonding of a component embedded in a printed circuit board.

The invention furthermore pertains to a printed circuit board with at least one insulated layer and at least one structured conductor layer with conductor paths, with at least one component, which, by means of an adhesive layer, is embedded into a recess of the printed circuit board, with its contacts essentially being situated in the plane of an outer surface of the printed circuit board exhibiting the at least one conductor layer, and with conductive connections between the contacts of the components and the conductor paths of the conductor layer.

Description of Related Art

The embedding of components, in particular of semiconductor chips, in printed circuit board structures is familiar to the professional, wherein within the scope of the invention, structures are contemplated in which the contacts of the component are essentially situated within one plane at the outer surface of the printed circuit board, also called "surface embedded components". The electrical contacts of the component must be bonded with a conductor pattern, for which various methods have been applied.

DE 10 2006 009 723 A1, for example, describes a method of embedding a component in a circuit board and of its contacts, in which a first insulating layer with a conductor pattern is applied to a metallic substrate. This is followed by the creation of a window or cut-out for the chip in the first layer, into which the chip—while leaving a gap—is inserted and, using an adhesive, is fixated to the substrate. In doing so, the contacts of the chip are situated on a bonding side facing away from the substrate. Applied on top of this configuration is a photoimageable second insulating layer, which leaves the contact points of the chip cleared, followed by electrical bonding by means of galvanic deposition of a conductor material between the contacts of the chip and the conductor pattern on the first layer. The known method and the resulting product have the disadvantage that in the spacing area between the chip and the adjacent layers a cavity remains, which during the buildup of additional layers may lead to delamination issues.

BRIEF SUMMARY OF THE INVENTION

One objective of this invention is to establish a method with the use of which a conductor pattern in the plane of the contacts, including the respective bondings, can be produced easily and cost-efficiently without the risk of detaching layers.

This objective is achieved with a printed circuit board comprising at least one insulating layer and at least one patterned conductive layer with at least one conductor path disposed atop the at least one insulating layer; at least one recess formed in at least one of the at least one insulating layer; at least one component comprising a plurality of contacts having spaces therebetween, that at least one component embedded in an adhesive layer disposed within the recess, wherein each of the plurality of contacts having an end face distal from the at least one component; and a plurality of conductive connections interconnecting the contacts of the component and the at least one conductor path of the patterned conductive layer, wherein the adhesive layer fully encloses all surfaces of the component except a surface from which the plurality of contacts extend; the spaces between each of the plurality of contacts of the component are filled with a resist; and a part of an additional conductive layer is arranged on a part of the resist.

In an embodiment, the plurality of contacts is configured to be positioned substantially perpendicular to a plane defined by the outer surface of the core.

In an embodiment, the conductive connections protrude from the resist.

In an embodiment, the resist covers the surfaces of the adhesive layer disposed between an outer wall of the component and an inner wall of the recess.

In an embodiment, the resist comprises at least one of a photoimageable resist, an epoxy-based lacquer, a photoimageable resist, and polyimide.

In an embodiment, the recess of the core extends through the conductive layer into the insulating layer.

In an embodiment, the resist covers a part of the component and a part of the at least one conductive layer.

In an embodiment, the contacts of the component are essentially situated in the plane of an outer surface of the core exhibiting the at least one conductive layer.

In an embodiment, the adhesive layer comprises at least one of a solvent-free adhesive, a low-solvent adhesive and a prepreg adhesive.

In an embodiment, each of the plurality of contacts is an elongated contact.

In an embodiment, the plurality of contacts and the at least one conductive layer lie in a single plane.

In an embodiment, a part of the resist is arranged on at least a part of the adhesive layer.

In an embodiment, the resist covers end faces of the adhesive layer between an outer wall of the component and an inner wall of the recess.

In an embodiment, portions of the additional conductive layer and portions of the at least one conductor path together form a patterned conductor path.

In an embodiment, the portions of the additional conductive layer and the plurality of conductive connections lie in a single plane.

In an embodiment, the part of the additional conductive layer, which is arranged on the part of the resist (9), belongs to the plurality of conductive connections.

In an embodiment, the conductive connections extend at least partly onto the resist.

In an embodiment, the additional conductive layer comprises the plurality of conductive connections.

In an embodiment, the additional conductive layer is applied onto the end faces of the plurality of contacts and to the at least one patterned conductive layer.

A method is disclosed with the following steps:

a) Provision of a core exhibiting at least one insulating layer and at least one conductor layer applied to the insulating layer, b) Embedding of at least one component into a recess of the insulating layer, wherein the contacts of the component are essentially situated within the plane of an outer surface of the printed circuit board exhibiting the at least one conductor layer, c) Application of a photoimageable lacquer on the one outer surface of the core on which the component is arranged while filling the spaces between the contacts of the component, d) Clearing of end faces of the contacts and of the regions covered by the photoimageable lacquer of the conductor layer by means of exposing and developing the photoimageable lacquer, e) using a semi-additive process, deposition of conductor material onto the cleared end faces of the contacts and the cleared regions of the conductor layer and forming of a conductor pattern at least on the one outer surface of the core on which the component is arranged, was well as the interconnecting paths between the contacts and the conductor pattern, and f) Removal of the sections of the conductor layer not belonging to the conductor pattern.

Thanks to the invention, embedded components can be "wired" in the same position or plane as the embedding, such that the printed circuit boards can be designed to be thinner and the aforementioned problems of the risk of detachment do not arise.

In doing so, it is recommended for the removal of the sections of the conductor layer in step f) is carried out by flash-etching.

Regarding the additional function of the photoimageable lacquer as a part of the finished printed circuit board, it is advantageous for the photoimageable lacquer used in step c) to be epoxybased lacquer.

In a particularly advantageous variation of the method according to the invention it may be provided that in step b) the component is embedded into an recess of the core using an adhesive layer, wherein the adhesive layer fully envelops all surfaces of the component—with the exception of those with the contacts—and essentially extends to the plane of the surface of the printed circuit board in which the end faces of the contacts are situated.

In a particularly expedient manner, the recess of the core extends through the conductor layer into the insulating layer.

The stated objectives will also be achieved with a printed circuit board of the above stated type, in which according to the present invention the connections and the conductor paths of the conductor layer are situated in one plane, where the adhesive layer completely envelops all surfaces of the component, except those with the contacts, where the spaces between the contacts of the component are filled with a cured, photoimageable lacquer, and an additional conductor layer is applied to the end faces of the contacts as well as to a conductor layer of the printed circuit board in the area of the conductor paths.

In a preferred embodiment, it is provided that the cured, photoimageable lacquer covers the cleared end faces of the adhesive layer between the outer wall of the component and the inner wall of the recess of the printed circuit board.

In one advanced embodiment of the invention, the printed circuit board again comprises a core exhibiting at least one insulating layer and at least one conductor layer having been applied to the insulating layer, wherein one outer surface of the core having been provided with at least one conductor layer exhibits a recess which extends through the conductor layer into the insulating layer, whereby the component is embedded into the recess of the core by means of an adhesive layer, and wherein the contacts of the component are essentially situated in the plane of the outer surface exhibiting the at least one conductor layer and the recess.

BRIEF DESCRIPTION OF THE SEVERAL VIEWS OF THE DRAWINGS

The invention and its further advantages is described in greater detail below based on a sample embodiment of the method and the circuit board, which is illustrated in the drawing. In this drawing show FIG. 1 in a section through a partial section a core made in the first steps of the method with an embedded component, FIG. 2 the structure of FIG. 1 after application of a photoimageable lacquer, FIG. 3 the structure after exposure and development of the photoimageable lacquer, FIG. 4 the structure after deposition of additional conductive material by application of a semi-additive process and FIG. 5 the structure of the finished printed circuit board after part of the conductive coatings have been etched away.

DETAILED DESCRIPTION OF THE INVENTION

The method according to the invention and the inventive printed circuit board will now be explained in reference to the figures. Therein, the term "core" used in the following in the context of the representational description shall be understood to mean a cured prepreg with a conductor layer (copper layer) on at least one surface.

Figure 1:
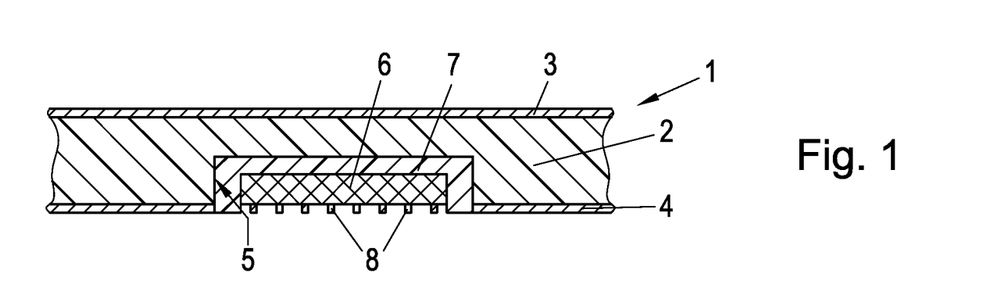

FIG. 1 shows a section of a core 1 consisting of an insulating layer 2, for example consisting of a prepreg material commonly used in the printed circuit board industry, like FR 4, and an upper conductor layer 3 as well as a lower conductor layer 4. At this point it shall be noted that the terms "upper" and "lower" refer to the representation in the drawings only, and are being used for an easier description. Layer thicknesses, for example, are 100 microns for the insulating layer 2 and 1 to 5 microns, typically 2 microns, for upper and lower conductor layer 3 and 4 respectively.

In the core 1, a recess 5 is formed, into which—using an adhesive layer 7—a component 6 is embedded, whereby the layer thickness of this adhesive layer, for example, is 20 to 200 microns. The component 6, a semiconductor chip, for example, carries on an outer surface contacts 8, e.g. copper pads, whereby the adhesive layer 7 envelops all surfaces of the component 6 with the exception of those with the contacts 8, and essentially extends to the plane of the surface of the core 1, in which the end faces of the contacts 8 are situated, in this case, therefore the bottom surface. One possible adhesive, for example, is a solvent-free or low-solvent epoxy resin adhesive with a glass softening point of typically between 120° and 150° C., which will be pressed, filled or injected into the recess 5. After placement of the component 6, this adhesive will be hardened at temperatures of 110° to 150° C.

Figure 2:
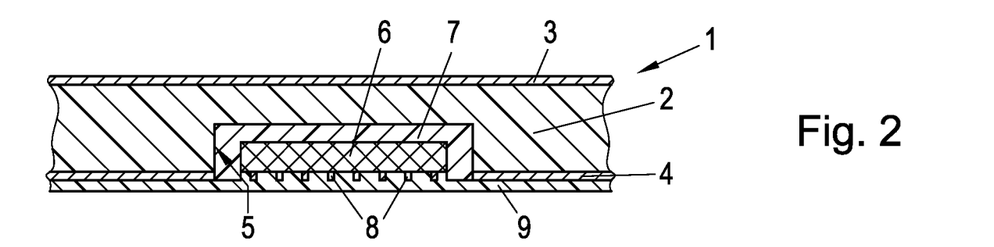

In a next step, an epoxy-based photoimageable resist 9 is applied at least to the outer surface of the core 1 with the end faces of the contacts 8, with reference being made to FIG. 2. Examples of products and materials suitable for this purpose are the XB7081 lacquer with the trade name Probelec® of the Huntsman Co. or the photoresist SU-8 from Microchem® Corp known from lithographic galvanoplasty (LIGA). As can be seen, the resist 9 is filling all spaces between the contacts 8 of the component 6, and also extends across the lower conductor layer 4.

Figure 3:
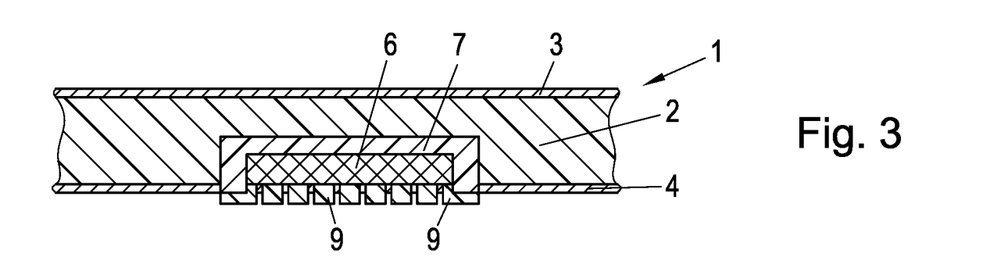

Thereafter, a photolithographic process commonly used in printed circuit board manufacturing can be used to create the pattern (structuring), starting with exposure using film masking or LDI (Laser Direct Imaging). This is followed by development, obtainment of the patterns after washing-off with suitable chemicals, and the complete curing of the material. Curing is performed by means of conventional curing methods like thermal curing, UV- or IR-curing, application of laser radiation etc. The structuring and the exposure is performed in such manner that the contacts 8, more specifically their end faces, will be cleared, for which purpose reference is made to FIG. 3. This structuring/imaging process is performed such that the cured, photoimageable resist 9 covers the clear end faces of the adhesive layer 7 between the outer wall of the component 6 and the inner wall of the recess 5 of the core 1, and that the lower conductor layer 4 is cleared again.

Figure 4:
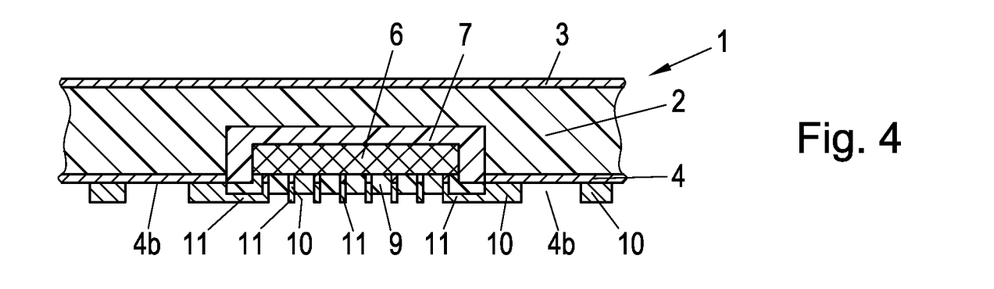

After this exposure and development, a semi-additive process for applying conductor material, among others, copper is applied according to the desired pattern. In doing so, a layer 10 of conductor material is applied in the desired areas, in particular for conductor paths, which is deposited also under formation of interconnecting paths 11 starting at the end faces 8 to the desired conductor pattern. The lower conductor layer 4, on the other hand, is amplified in the area of the desired conductor paths or conductor pattern. This result is shown in FIG. 4.

Figure 5:
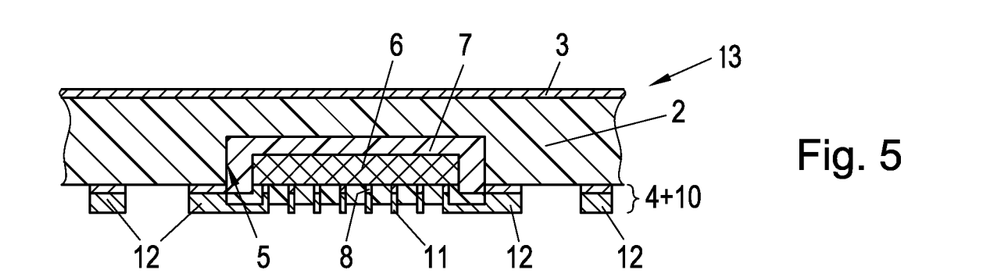

Since bridges 4b continue to exist between the thickened sections of the lower conductor layer 4 through layer 10, which are to form the conductor paths, these bridges 4b and any other undesirable conductor material is removed in an additional step. This is preferably done using so-called "flash etching", meaning the etching-off of the base copper foil and low-grade removal of the galvanically deposited copper layers. This etching process is performed, for example, with an acidic medium, e.g. HCl with the addition of $H_2O_2$ and of stabilizers, wherein the small crystallites of the base film are dissolved significantly faster than the electro-deposited layers, and selective etching is achieved. After this process of removing and etching, the surfaces and spaces between the contacts 9 are cleaned as well and the final conductor paths 12 have emerged and are completely formed, as referenced in FIG. 5, which shows the finished printed circuit board 13 with the embedded and bonded component 6.

In the example shown, only the structuring of the lower conductor layer 4 is described, but it should be clear that the upper conductor layer 3 may also be patterned in the same way. Also possible is the formation of vias (conductive feed-throughs) between the two conductor layers, just as additional insulating and conductor layers may be formed.

Finally, it should be understood that the representations in FIGS. 1 to 5 generally only show detail sections of a larger printed circuit board pattern, and that in practice, a plurality of components may be embedded and connected to conductor patterns at different locations on a printed circuit board.

A method of bonding of a component embedded into a printed circuit board is disclosed, comprising the following steps: providing a core exhibiting at least one of at least one insulating layer and at least one conductive layer applied to the insulating layer and defining an outer layer of the core, embedding at least one component into a recess of the insulating layer, the at least one component having a plurality of contacts separated by a plurality of spaces, each of the plurality of contacts having an end face distal from the at least one component, depositing a layer of conductive material onto the end faces of the contacts and the conductive layer, and forming a conductor pattern on at least one outer surface of the core, and a plurality of interconnecting paths between the plurality of contacts and the conductor pattern.

In an embodiment, the plurality of contacts are configured to be positioned substantially perpendicular to a plane formed by the at least one outer surface of the core.

In an embodiment, the method comprises the further steps of: applying a resist onto the one outer surface of the core and/or the component such that the spaces between each of the plurality of contacts of the component are filled by the resist.

In an embodiment, the method comprises the further step of: clearing the resist from the end faces of the contacts and the conductive layer by exposing and developing the resist, wherein the layer of conductive material is deposited onto the cleared end faces of the contacts and the conductive layer.

In an embodiment, the end face of each of the contacts is on a retracted position with respect to an outer surface of the component.

In an embodiment, the conductor pattern and the plurality of interconnecting paths are formed by one of a subtractive process, an additive process and a semi-additive process.

In an embodiment, the method a further comprises a step of: adding at least one further conductive layer onto the layer of conductive material.

In an embodiment, the method comprises a step of removing portions of the conductive layer not incorporated into the conductor pattern.

In an embodiment, the removal of the areas of the conductive layer occurs by flash-etching.

In an embodiment, the applied resist comprises at least one of a photoimageable resist, an epoxy-based lacquer, a photoimageable resist, and polyimide.

In an embodiment, the embedding of the at least one component further comprises applying an adhesive layer into the recess of the core such that the adhesive layer fully encloses all surfaces of the component, except for the surface of the component from which the plurality of contacts extends, the adhesive layer extending substantially to the plane of the core.

In an embodiment, the recess of the core extends through the conductive layer into the insulating layer.

In an embodiment, the adhesive layer comprises at least one of a solvent-free adhesive, a low-solvent adhesive and a prepreg adhesive.

In an embodiment, the resists covers a part of the component and a part of the at least one conductive layer.

In an embodiment, the contacts of the component are essentially situated in the plane of the at least one outer surface of the core exhibiting the at least one conductive layer.

In an embodiment, the recess is a through hole passing the core, wherein the embedding of the at least one component into the recess of the insulating layer is made by the following steps: applying a temporary carrier onto the core below the recess, placing the component into the recess and attaching the component to the temporary carrier so that the contacts of the component are located on that side of the component which is attached to the temporary carrier, applying a first connecting layer onto the core on a side of the core opposite to the temporary carrier, wherein the first connecting layer enters the recess to adhere the at least one component in the recess, and removing the temporary carrier from the core.

In an embodiment, the method further comprises a step of: applying a second connecting layer onto the core on a side of the core opposite to the first connecting layer.

In an embodiment, the first connecting layer is a prepreg layer which is laminated onto the core.

A method of bonding of a component embedded into a printed circuit board is disclosed, comprising the following steps: providing a core exhibiting at least one insulating layer, embedding at least one component into a recess of the insulating layer, the at least one component having a plurality of contacts separated by a plurality of spaces, each of the plurality of contacts having an end face distal from the at least one component, sputtering a conductive layer onto the insulating layer, the conductive layer defining an outer layer of the core, and depositing at least one layer of conductive material onto the end faces of the contacts and the sputtered conductive layer, and forming a conductor pattern on at least one outer surface of the core, and a plurality of interconnecting paths between the plurality of contacts and the conductor pattern.

In an embodiment, the plurality of contacts are configured to be positioned substantially perpendicular to a plane formed by an outer surface of the core.

In an embodiment, the method further comprises the steps of: applying a resist onto the one outer surface of the core and/or the component such that the spaces between each of the plurality of contacts of the component are filled by the resist.

In an embodiment, the method further comprises a step of: clearing end faces of the contacts by exposing and developing the resist, wherein the layer of conductive material is deposited onto the cleared end faces of the contacts and the conductive layer.

In an embodiment, the method comprises a step of removing portions of the conductive layer not incorporated into the conductor pattern.

In an embodiment, the removal of the areas of the conductive layer occurs by flash-etching.

In an embodiment, the applied resist comprises at least one of a photoimageable resist, an epoxy-based lacquer, a photoimageable resist, and polyimide.

In an embodiment, the embedding of the at least one component further comprises applying an adhesive layer into the recess of the core such that the adhesive layer fully encloses all surfaces of the component, except for the surface of the component from which the plurality of contacts extend, the adhesive layer extending substantially to the plane of the core.

In an embodiment, the recess of the core extends through the conductive layer into the insulating layer.

In an embodiment, the resists covers a part of the component and a part of the at least one conductive layer.

In an embodiment, the contacts of the component are essentially situated in the plane of an outer surface of the core exhibiting the at least one conductive layer.

In an embodiment, the recess is a through hole passing the core, wherein the embedding of the at least one component into the recess of the insulating layer is made by the following steps: applying a temporary carrier onto the core below the recess, placing the component into the recess and attaching the component to the temporary carrier so that the contacts of the component are located on that side of the component which is attached to the temporary carrier, applying a first connecting layer onto the core on a side of the core opposite to the temporary carrier, wherein the first connecting layer enters the recess to adhere the at least one component in the recess, and removing the temporary carrier from the core.

In an embodiment, the method further comprises a step of: applying a second connecting layer onto the core on a side of the core opposite to the first connecting layer.

In an embodiment, the first connecting layer is a prepreg layer which is laminated onto the core.

A Printed circuit board is disclosed, comprising: at least one insulating layer and at least one patterned conductive layer with at least one conductor path disposed atop the at least one insulating layer, at least one recess formed in at least one of the at least one insulating layer and the at least one patterned conductive layer, wherein at least one of the at least one conductive layer and the at least one recess define an outer surface of a core of the printed circuit board, at least one component comprising a plurality of contacts having spaces therebetween, that at least one component embedded in an adhesive layer disposed within the recess, and further comprising a plurality of conductive connections interconnecting the contacts of the component and the at least one conductor path of the patterned conductive layer wherein: the plurality of conductive connections and the at least one conductor path of the patterned conductive layer lie in a single plane, the adhesive layer fully encloses all surfaces of the component except a surface from which the plurality of contacts extend, the spaces between each of the plurality of contacts of the component are filled with a resist, and each of the plurality of contacts having an end face distal from the at least one component, and an additional conductive layer being applied onto the end faces of the plurality of contacts and to the at least one patterned conductive layer in the area of the at least one conductor path.

In an embodiment, the plurality of contacts are configured to be positioned substantially perpendicular to a plane defined by the outer surface of the core.

In an embodiment, the conductive connections extend at least partly onto the resist.

In an embodiment, the resist covers the surfaces of the adhesive layer disposed between an outer wall of the component and an inner wall of the recess.

In an embodiment, the resist comprises at least one of a photoimageable resist, an epoxy-based lacquer, a photoimageable resist, and polyimide.

In an embodiment, the recess of the core extends through the conductive layer into the insulating layer.

In an embodiment, the resists covers a part of the component and a part of the at least one conductive layer.

In an embodiment, the contacts of the component are essentially situated in the plane of an outer surface of the core exhibiting the at least one conductive layer.

In an embodiment, the adhesive layer comprises at least one of a solvent-free adhesive, a low-solvent adhesive and a prepreg adhesive.

In an embodiment, each of the plurality of contacts is an elongated contact.

What is claimed is:
1. A printed circuit board comprising:
at least one insulating layer and at least one patterned conductive layer with at least one conductor path disposed atop the at least one insulating layer;
at least one recess formed in at least one of the at least one insulating layer;

at least one component including a plurality of contacts having spaces therebetween, the at least one component embedded in an adhesive layer disposed within the recess, wherein each of the plurality of contacts having an end face distal from the at least one component; and a plurality of conductive connections interconnecting the plurality of contacts of the component and the at least one conductor path of the patterned conductive layer; wherein:

the adhesive layer fully encloses all surfaces of the component except a surface from which the plurality of contacts extend;

the spaces between each of the plurality of contacts of the component are filled with a resist; and a part of an additional conductive layer is arranged on a part of the resist;

wherein the additional conductive layer being different from the patterned conductive layer and different from the plurality of conductive connections.

2. The printed circuit board according to claim 1, wherein the plurality of contacts are perpendicular to a plane defined by an outer surface of a core.

3. The printed circuit board according to claim 1, wherein the conductive connections protrude from the resist.

4. The printed circuit board according to claim 1, wherein the resist covers any surfaces of the adhesive layer disposed between an outer wall of the component and an inner wall of the recess.

5. The printed circuit board according to claim 1, wherein the resist includes at least one of a photoimageable resist, an epoxy-based lacquer, a photoimageable resist, and polyimide.

6. The printed circuit board according to claim 1, wherein a recess of a core extends through the conductive layer into the insulating layer.

7. The printed circuit board according to claim 1, wherein the resists covers a part of the component and a part of the at least one conductive layer.

8. The printed circuit board according to claim 1, wherein the plurality of contacts of the component are essentially situated in a plane of an outer surface of a core exhibiting the at least one conductive layer.

9. The printed circuit board according to claim 1, wherein the adhesive layer includes at least one of a solvent-free adhesive, a low-solvent adhesive and a prepreg adhesive.

10. The printed circuit board according to claim 1, wherein each of the plurality of contacts is an elongated contact.

11. The printed circuit board according to claim 1, wherein the plurality of contacts and the at least one conductive layer lie in a single plane.

12. The printed circuit board according to claim 1, wherein a part of the resist is connected to at least a part of the adhesive layer.

13. The printed circuit board according to claim 12, wherein the resist covers end faces of the adhesive layer between an outer wall of the component and an inner wall of the recess.

14. The printed circuit board according to claim 1, wherein portions of the additional conductive layer and portions of the at least one conductor path together form a patterned conductor path.

15. The printed circuit board according to claim 14, wherein the portions of the additional conductive layer and the plurality of conductive connections lie in a single plane.

16. The printed circuit board according to claim 1, wherein the plurality of conductive connections includes the part of the additional conductive layer connected to the part of the resist.

17. The printed circuit board according to claim 1, wherein the conductive connections extend further onto the resist.

18. The printed circuit board according to claim 1, wherein the additional conductive layer includes the plurality of conductive connections.

19. The printed circuit board according to claim 1, wherein the additional conductive layer is coupled on the end faces of the plurality of contacts and to the at least one patterned conductive layer.

* * * * *

UNITED STATES PATENT AND TRADEMARK OFFICE
CERTIFICATE OF CORRECTION

PATENT NO. : 12,185,478 B2
APPLICATION NO. : 18/055759
DATED : December 31, 2024
INVENTOR(S) : Gerald Weidinger, Andreas Zluc and Johannes Stahr Page 1 of 1

It is certified that error appears in the above-identified patent and that said Letters Patent is hereby corrected as shown below:

In the Specification

Column 1, Line 13, delete "Feb. 2, 2015" and add -- Feb. 26, 2015 --

Signed and Sealed this
Eighteenth Day of February, 2025

Coke Morgan Stewart
*Acting Director of the United States Patent and Trademark Office*